(12) United States Patent
Nguyen et al.

(10) Patent No.: US 7,286,577 B2
(45) Date of Patent: Oct. 23, 2007

(54) LASER WAVELENGTH ACTUATORS

(75) Inventors: Hoang Tan Nguyen, Livermore, CA (US); Weizhi Wang, San Jose, CA (US)

(73) Assignee: Bookham Technology PLC, Abington (GB)

( * ) Notice: Subject to any disclaimer, the term of this patent is extended or adjusted under 35 U.S.C. 154(b) by 294 days.

(21) Appl. No.: 10/976,114

(22) Filed: Oct. 28, 2004

(65) Prior Publication Data

US 2006/0092996 A1    May 4, 2006

(51) Int. Cl.
  *H01S 3/115*   (2006.01)
  *H01S 3/10*   (2006.01)

(52) U.S. Cl. .......................................... 372/12; 372/20

(58) Field of Classification Search ................ 372/12, 372/20
See application file for complete search history.

(56) References Cited

U.S. PATENT DOCUMENTS 7,027,469 B2 *  4/2006  Sidorin et al. ................ 372/20

* cited by examiner

*Primary Examiner*—Armando Rodriguez
(74) *Attorney, Agent, or Firm*—Meyertons Hood Kivlin Kowert & Goetzel, P.C.; B. Noël Kivlin

(57) ABSTRACT

A laser-emitting device may be coupled to an electro-optically controlled wavelength actuator. An electro-optically controlled wavelength actuator may be a holographic wavelength actuator or a liquid crystal wavelength actuator. The electro-optically controlled wavelength actuator may function as a tunable diffraction grating for external cavity lasers.

23 Claims, 3 Drawing Sheets

Grating-Angle Tuning

Cavity-Length Tuning

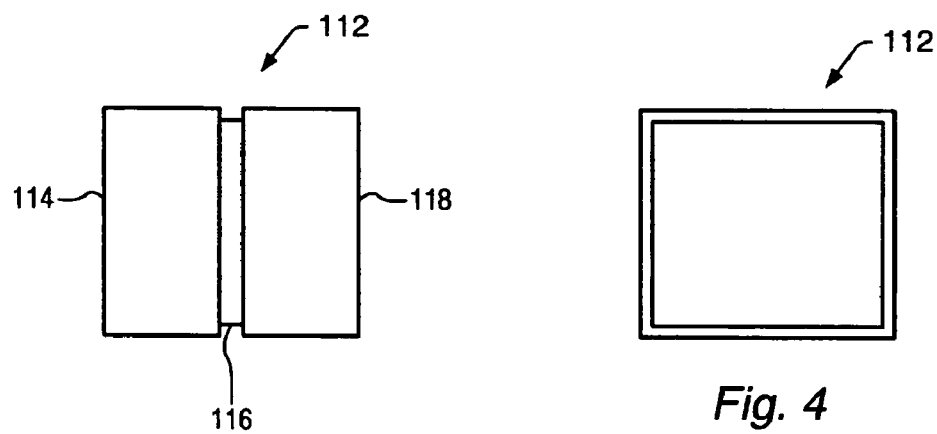
Fig. 3
Fig. 4
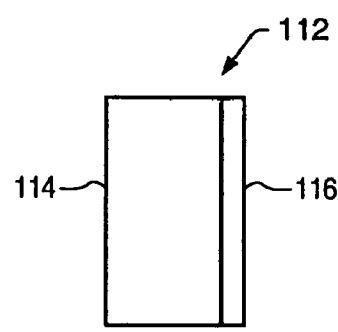
Fig. 5
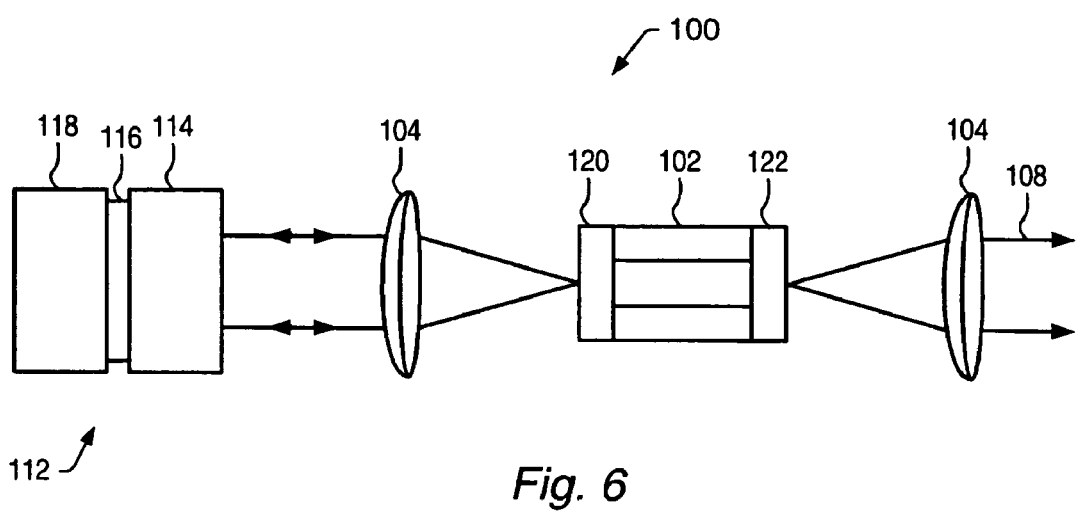
Fig. 6

LASER WAVELENGTH ACTUATORS

BACKGROUND

1. Field of the Invention

The present invention relates to wavelength actuators used in laser cavities. Certain embodiments relate to holographic gratings and liquid crystal switchable gratings.

2. Description of the Related Art

Tunable lasers are very useful in the optical networking and telecommunications industry. Tunable lasers provide the benefit over fixed-wavelength lasers of allowing one laser to produce light at a variety of wavelengths. A tunable laser allows selection or tuning of the laser to a specific wavelength or a specific range of wavelengths. Some examples of tunable lasers include, but are not limited to, distributed-feedback lasers (DFBs), distributed-Bragg reflector lasers (DBRs), vertical-cavity semiconductor lasers (VCSELs) that employ microelectromechanical systems technology, and external-cavity diode lasers (ECLs).

In an ECL, at least some portion (e.g., wavelength tuning components) of the laser cavity resides off the laser-emitting device (e.g., a laser diode). ECLs may provide a wide range for wavelength tuning (e.g., about 100 nm or greater, or from the visible range to the infrared range), very narrow line widths, and very high output powers relative to other tunable lasers.

Several different methodologies may be used for wavelength selection and wavelength tuning in ECLs. Wavelength selection and tuning methodologies include, but are not limited to, mechanical tuning, thermal tuning, and/or electro-optical tuning. Mechanical tuning involves the use of motors and/or actuators to mechanically move parts in a laser cavity. Thermal tuning involves the movement of parts by direct thermal expansion or direct thermal contraction of materials in the laser cavity. Mechanical and thermal tuning may have problems associated with repeatability of the tuning and/or stability in the tuning due to the movement of parts. In addition, minimum tolerances may be difficult to maintain in mechanical and thermal tuning due to moving parts. Electro-optical tuning employs a crystal or a solid-state device that allows for electrical manipulation of the optical properties of the crystal or solid-state device.

Wavelength selection and tuning are important for selectable single frequency operation in a laser cavity. Selectable single frequency operation may be accomplished with a narrowband filter in a laser cavity. For example, a diffraction grating may be used for band filtering in a laser cavity.

FIG. 1 depicts a schematic of an embodiment of an external cavity laser configuration. Laser emitting device 102 may be coupled to lens 104 and diffraction grating 106. Lens 104 may be a collimating lens. The laser cavity may produce laser light output 108. Diffraction grating 106 along with retroreflector 110 may be used to select and/or tune a wavelength of laser light output 108.

Filtering in the laser cavity may be used to select an axial mode of the laser light. Cavity length of the laser cavity may also be altered to select an exact laser light wavelength. FIG. 2 depicts schematics of embodiments for wavelength tuning including grating angle tuning (FIG. 2A) and cavity length tuning (FIG. 2B). In FIGS. 2A and 2B, the dashed vertical lines depict the axial modes of the cavity while the solid line depicts the cavity filter function. In each tuning method, the cavity filter initially selects an axial mode (e.g., axial mode q, as shown in FIG. 2).

Filtering typically involves changing the angle of a diffraction grating to shift a center wavelength of the cavity filter, as shown by the arrow in FIG. 2A. Cavity length tuning involves changing the optical path length in the cavity. Mechanically moving parts to adjust the path length or altering an index of refraction of a material along the optical path may change the optical path length. Changing the optical path length moves the axial modes (e.g., the dashed lines in FIG. 2B), which allows different axial modes to be selected.

Some tunable lasers (e.g., external cavity lasers) may be susceptible to mode hopping. Mode hopping may result from a mismatch between a change in the resonant wavelength of the laser cavity and an accompanying change in the optical path length of the laser cavity. For example, such a mismatch may upset a mathematical ratio that controls the design of the laser cavity and cause the laser to hop one mode. Mode hopping may be prevented by adjusting the angle of a diffraction grating and/or the cavity length. For ultra-broadband, mode hop-free tuning, both diffraction grating angle tuning and cavity length tuning may be used in tandem.

SUMMARY

In an embodiment, an electro-optically controlled wavelength actuator may be used to select and tune a laser output from a laser cavity. The electro-optically controlled wavelength actuator may be optically coupled to a laser-emitting device (e.g., a laser emitting diode). An electro-optically controlled wavelength actuator may act as a diffraction grating. Varying a voltage and/or current applied to the electro-optically controlled wavelength actuator may control the optical properties of the actuator.

In an embodiment, the electro-optically controlled wavelength actuator may be a holographic wavelength actuator. A holographic wavelength actuator may be coupled to an electro-optic crystal in a volume configuration or in a surface relief configuration. In certain embodiments, the electro-optic crystal may be used to adjust one or more properties of the holographic wavelength actuator. In an embodiment, a grating angle of the holographic wavelength actuator and/or an index of refraction of the electro-optic crystal may be adjusted to select and tune a wavelength of a laser output.

In another embodiments, the electro-optically controlled wavelength actuator may be a liquid crystal wavelength actuator. A grating period of a wavelength actuator may be adjusted by varying a voltage applied to the electro-optically controlled wavelength actuator.

An electro-optically controlled wavelength actuator may be used to select a wavelength of a laser output, tune a wavelength of a laser output, and/or stabilize a laser output wavelength. Adjustment of an electro-optically controlled wavelength actuator may be used to tune a laser cavity and/or actively compensate for mode hop in the laser cavity.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 3 depicts a side view of an embodiment of a holographic wavelength actuator in a volume configuration.

FIG. 4 depicts an end view of the embodiment depicted in FIG. 3.

FIG. 5 depicts a side view of an embodiment of a holographic wavelength actuator in a surface relief configuration.

FIG. 6 depicts a schematic of an embodiment of an external cavity laser configuration.

Figure 1:
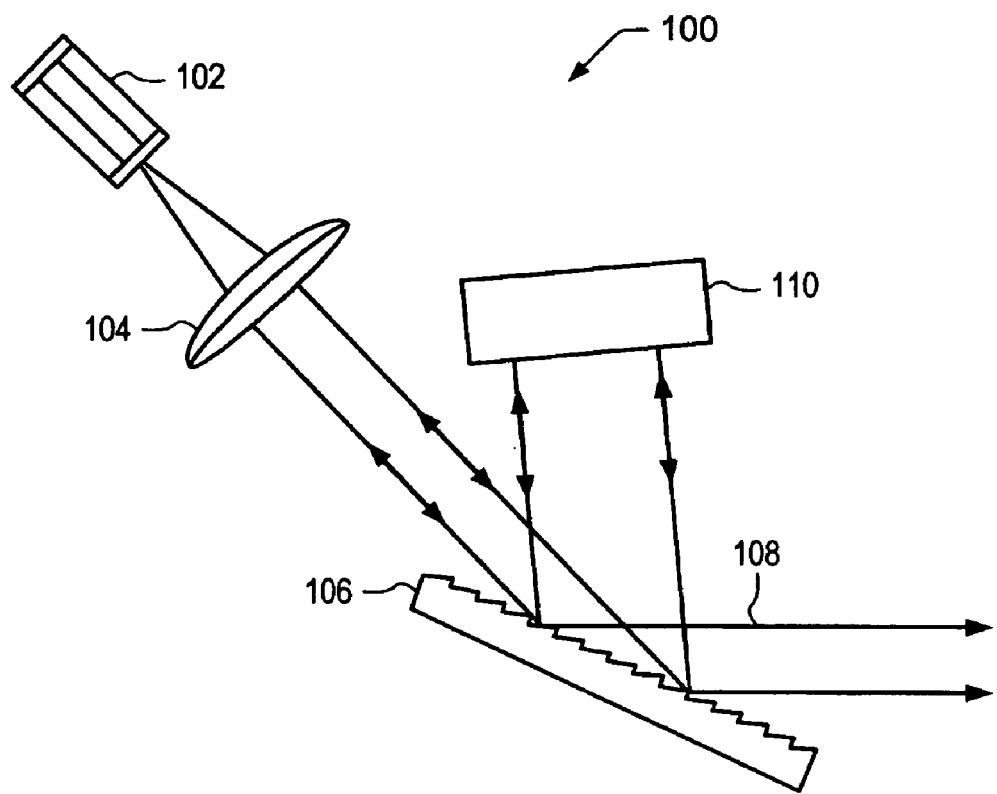
FIG. 1 depicts a schematic of an embodiment of an external cavity laser configuration.
Figure 2A:
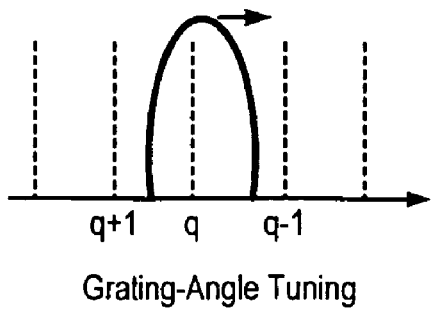
FIG. 2 depicts schematics of embodiments for wavelength tuning.
Figure 2B:
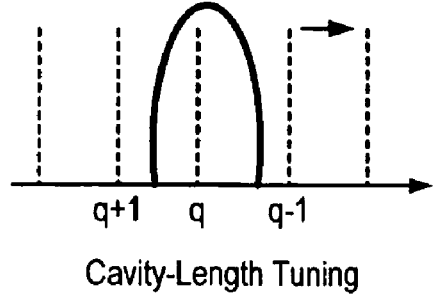

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Electro-optically controlled wavelength actuator may be used for wavelength tuning, wavelength stabilization, and/or active mode hop suppression. An electro-optically controlled wavelength actuator may be a holographic wavelength actuator or a liquid crystal wavelength actuator. In some embodiments, the electro-optically controlled wavelength actuator may act as a diffraction grating. Modification of the grating diffraction center wavelength and/or the laser cavity length (i.e., the optical path length in the cavity) may be used to tune a wavelength and correct for mode hop. In certain laser cavities, the grating angle and/or the laser cavity length are modified by mechanical manipulation (e.g., using motors or actuators) or thermal manipulation (e.g., by material expansion) of the wavelength actuator or other laser cavity components. In certain embodiments, electro-optic tuning using a piezo device or a crystal (e.g., $LiNbO_3$) may be used for manipulation of the wavelength actuator and/or the optical path length.

In an embodiment, a holographic wavelength actuator may be used for electro-optic tuning of a laser cavity. A holographic wavelength actuator on a crystal or piezo device may allow for wavelength selection, wavelength tuning, active mode hop suppression, and wavelength stabilization without a need for mechanical or thermal manipulation of the laser cavity components. In certain embodiments, a holographic wavelength actuator may be used in existing laser cavities (e.g., Littrow laser cavities) in place of a conventional grating to remove the need for mechanical manipulation and to compensate changes in wavelength properties due to environmental perturbations (e.g., temperature changes or other climatic changes).

FIG. 3 depicts a side view of an embodiment of holographic wavelength actuator 112 in a volume configuration. FIG. 4 depicts an end view of the embodiment depicted in FIG. 3. Wavelength actuator 112 may include crystal 114. Crystal 114 may be an electro-optic crystal. In an embodiment, crystal 114 is $LiNbO_3$. Crystal 114 may be any electro-optic crystal that produces a net optical path length change with a change in applied voltage or current. Crystal 114 may be optically transparent at wavelengths selected for use of holographic wavelength actuator 112.

A holographic forming material 116 may be coupled to crystal 114. Within holographic material 116 an image of a diffraction grating may be formed. Any material used for the fabrication of holographic images may be coupled to crystal 114. In some embodiments, holographic material includes a dichromatic gelatin. In other embodiments, holographic material may include OmniDex® available from DuPont (Wilmington, Del.)). Holographic materials include polymer films in which holographic images have been created. Alternately, monomers may be used to form a hologram, where the hologram is imaged and the monomer is subsequently cured.

In a volume configuration embodiment, holographic material 116 may represent a diffraction grating that is formed by the periodic variation of the refractive index inside the holographic grating. In a volume configuration embodiment, light is diffracted within the volume of the holographic material 116.

Holographic material 116 may be placed directly on crystal 114. For example, holographic material 116 may be coupled to crystal 114 using an adhesive. In certain embodiments, glass 118 may be coupled to holographic material 116 and crystal 114, as shown in FIG. 3. Glass 118 may be an optically transmissive material. For example, glass 118 may be fused silica glass. Glass 118 may confine and/or protect holographic grating 116.

FIG. 5 depicts a side view of an embodiment of holographic wavelength actuator 112 in a surface relief configuration. Holographic wavelength actuator 112 includes a holographic material 116 coupled to crystal 114. Holographic material 116 may be coupled directly on crystal 114 with, for example, an adhesive. In a surface relief configuration embodiment, light is diffracted at the surface of holographic material 116.

In a surface relief configuration embodiment, holographic material 116 may include a series of interference fringes. These interference fringes may be formed or recorded on a photosensitive layer of the holographic material and may correspond to grooves of a desired grating pattern. Holographic material 116 may undergo subsequent chemical treatment (e.g., selective dissolution) to form a modulated profile on the surface of the photosensitive layer.

Crystal 114 may be used to vary electro-optical properties of holographic wavelength actuator 112 for wavelength selection, wavelength tuning, wavelength stabilization, and/or active mode hop suppression. Adjusting the voltage and/or the current applied to crystal 114 may vary the electro-optical properties of holographic wavelength actuator 112. In certain embodiments, application of voltage and/or current to crystal 114 may be used to vary an index of refraction of holographic wavelength actuator 112 to change the grating diffraction center wavelength and the cavity length for wavelength tuning.

In some embodiments, holographic wavelength actuator 112 may inhibit mode hopping in a laser cavity during coarse wavelength tuning. In some embodiments, both grating angle tuning and cavity length tuning may be used to inhibit mode hopping in a laser cavity during tuning (e.g., for tuning ranges of several nanometers).

In certain embodiments, holographic wavelength actuator 112 may be used in selected laser cavity configurations (e.g., a Littrow laser cavity configuration, a Ricci laser cavity configuration, or a Littman-Metcalf laser cavity configuration). Holographic wavelength actuator 112 may allow for relatively fast wavelength selection, wavelength tuning, and/or active mode hop suppression. A holographic wavelength actuator allows for wavelength selection, wavelength tuning, and/or active mode hop suppression without the use of mechanically moving parts in a laser cavity. Mechanically moving parts in a laser cavity may be susceptible to environmental changes and/or may be more apt to fail or break down with repeated use. Using a holographic wavelength actuator may allow for a smaller and more rugged laser cavity configuration (e.g., less sensitive to environmental changes and less likely to fail or break down with use). Using a holographic wavelength actuator may also reduce a cost for constructing and/or operating a laser cavity.

FIG. 6 depicts a schematic of an embodiment of an external cavity laser configuration with holographic wavelength actuator 112. Other external cavity laser configurations may also be used (e.g., a Littrow laser cavity configuration or a Littman-Metcalf laser cavity configuration). Wavelength actuator 112 may be optically coupled to laser emitting device 102. Laser emitting device 102 may be, for example, a laser emitting diode. In certain embodiments, laser-emitting device 102 may operate as a gain medium for laser light.

Coating 120 may be located on laser emitting device 102. Coating 120 may be an anti-reflection (AR) coating. An AR coating may be used to enhance transmission of one or more specific wavelengths or a specific range of wavelengths.

Laser light propagating between laser-emitting device 102 and wavelength actuator 112 may be collimated by lens 104. In some embodiments, wavelength actuator 112 may be located in a cavity external to laser emitting device 102. Laser light output 108 may be collimated by lens 104.

In certain embodiments, an electro-optically controlled wavelength actuator may be a liquid crystal actuator. A liquid crystal actuator may allow for wavelength selection, wavelength tuning, active mode hop suppression, and/or wavelength stabilization in a laser cavity during operation (i.e., in real time) without mechanical or thermal adjustment.

In an embodiment, a liquid crystal wavelength actuator acts as a switchable diffraction grating. A liquid crystal switchable diffraction grating may include an electro-optical crystal that controls properties of the wavelength actuator. A liquid crystal wavelength actuator may be electro-optically controlled (e.g., voltage controlled) so that no mechanical movement is needed for wavelength selection, wavelength tuning, active mode hop suppression, and/or wavelength stabilization in a laser cavity. Eliminating the need for mechanical movement for wavelength selection, wavelength tuning, active mode hop suppression, and/or wavelength stabilization may provide a laser cavity that is less sensitive to environmental perturbations (e.g., temperature changes or other climatic changes). Using a liquid crystal wavelength actuator in a laser cavity may also be less expensive and more reliable than using other types of wavelength actuators in a laser cavity.

In an embodiment, a liquid crystal wavelength actuator may be made in a similar manner and include materials similar to liquid crystal displays. A liquid crystal wavelength actuator may be used as a transmissive or reflective grating depending on a laser cavity configuration. In certain embodiments, properties of a liquid crystal wavelength actuator (e.g., period of the grating profile produced by the grating, variation in index of refraction, and/or diffraction efficiency) may be adjusted during use of a laser cavity regardless of whether the liquid crystal wavelength actuator is used as a transmissive grating or a reflective grating.

Figure 7:
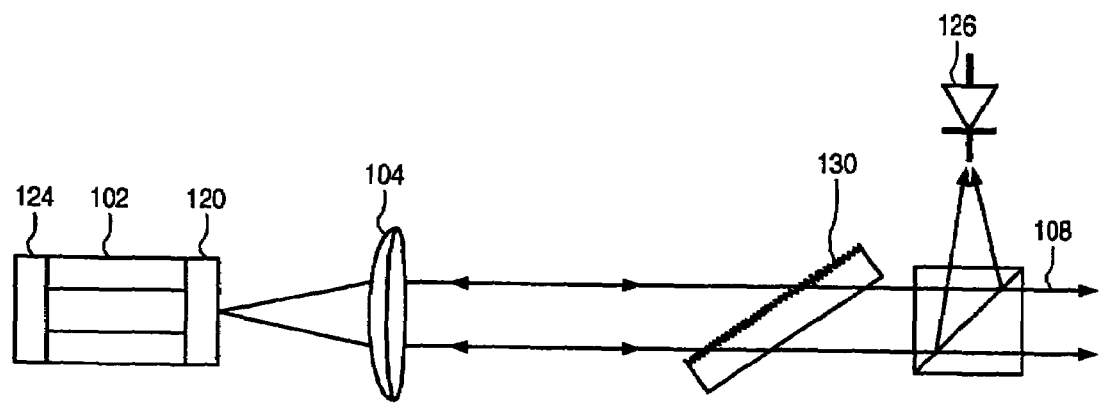
FIG. 7 depicts a schematic of an embodiment of a Littrow laser configuration.

FIG. 7 depicts a schematic of an embodiment of a Littrow laser configuration that includes a wavelength actuator 130. While the following description describes the use of a liquid crystal wavelength actuator, it should be understood that wavelength actuator 130 may be a holographic wavelength actuator or a liquid crystal wavelength actuator. Laser emitting device 102 is optically coupled to wavelength actuator 130. In certain embodiments, wavelength actuator 130 is a liquid crystal wavelength actuator. Laser emitting device 102 may have coating 120 on one end and coating 124 on a second end. In certain embodiments, coating 120 is AR coating and coating 124 is HR coating. Coatings 120, 124 may be selected to enhance transmission of selected wavelengths from the laser cavity. Laser light may be collimated by lens 104 between laser emitting device 102 and wavelength actuator 130. A portion of laser output 108 may be spliced and propagated to power monitor 126.

In the embodiment depicted in FIG. 7, varying of the voltage applied to liquid crystal wavelength actuator 130 may adjust the period of the actuator. Adjustment of the period of the grating profile produced by the liquid crystal wavelength actuator 130 may be used for wavelength tuning in the laser cavity configuration. Thus, liquid crystal wavelength actuator 130, as depicted in FIG. 7, may be used for wavelength selection and wavelength tuning while also providing wavelength stabilization in the laser cavity. In certain embodiments, liquid crystal wavelength actuator 130 may also be used to actively inhibit mode hopping while providing for wavelength tuning.

Figure 8:
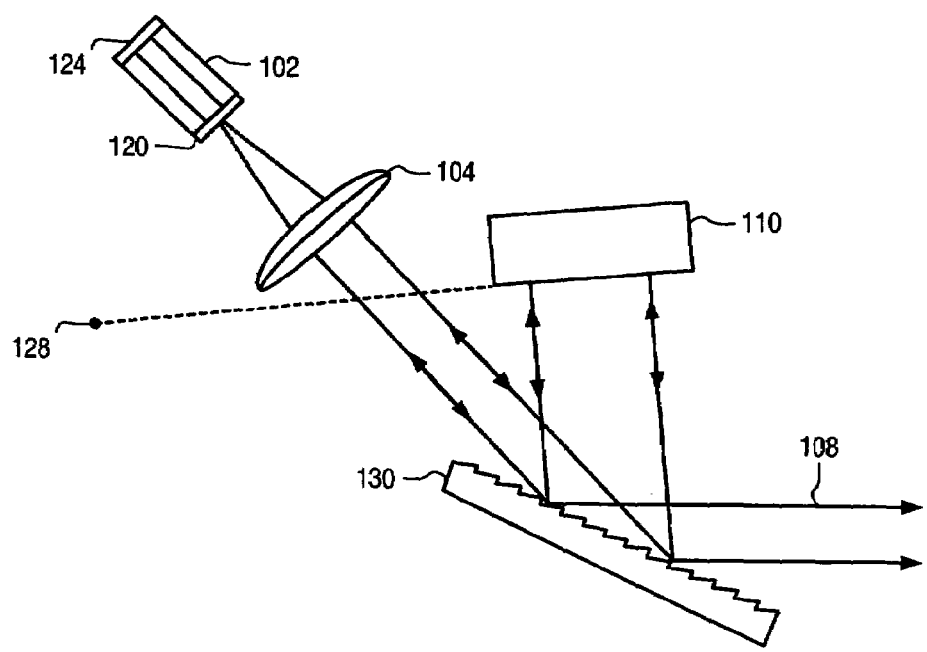
FIG. 8 depicts a schematic of an embodiment of a Littman-Metcalf laser configuration.

FIG. 8 depicts a schematic of an embodiment of a Littman-Metcalf laser configuration having a wavelength actuator. Wavelength tuning may be accomplished by adjustment retroreflector 110 with respect to a pivot point 128. While the following description describes the use of a liquid crystal wavelength actuator, it should be understood that wavelength actuator 130 may be a holographic wavelength actuator or a liquid crystal wavelength actuator. Laser emitting device 102 is optically coupled to wavelength actuator 130. In an embodiment, liquid crystal wavelength actuator 130 is a switchable grating as described above.

In certain embodiments, wavelength actuator 130 may be used for wavelength selection. Wavelength actuator 130 may also be used for active mode hop suppression. Active mode hop compensation may correct for asynchronous tuning in the laser cavity. Asynchronous tuning may be caused by, for example, changes in pivot point 128 due to mechanical or thermal shifts in the laser cavity and/or manufacturing tolerances of the laser cavity. Adjusting the period of the grating profile in wavelength actuator 130 (e.g., by varying the voltage applied to the wavelength actuator) may be used for active mode hop compensation. In certain embodiments, wavelength actuator 130, as shown in FIG. 8, may be used for fine (narrow bandwidth) wavelength tuning in addition to active mode hop suppression.

In certain embodiments, broad wavelength selection may be determined by adjusting physical properties of a laser cavity (e.g., mechanical tuning) and fine-tuning of the wavelength and/or active mode hop suppression may be obtained using a wavelength actuator (e.g., a holographic wavelength actuator or a liquid crystal wavelength actuator). Combining mechanical tuning for broad wavelength selection with electro-optical fine tuning using a wavelength actuator may allow for an electro-optically tunable laser that is usable over a broad range of wavelengths.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A laser output device, comprising:
  a laser emitting device configured to provide a laser output; and
  a holographic wavelength actuator optically coupled to the laser emitting device, wherein the holographic wavelength actuator comprises:
    an electro-optic crystal; and
    a holographic material coupled to the electro-optic crystal;
  wherein one or more properties of the holographic wavelength actuator are configured to be adjusted to select and tune a wavelength of the laser output.

2. The laser output device of claim 1, wherein the laser emitting device comprises a laser emitting diode.

3. The laser output device of claim 1, wherein the laser output device is located in a laser cavity.

4. The laser output device of claim 1, wherein the laser output device is located in a Littman-Metcalf cavity configuration.

5. The laser output device of claim 1, wherein the electro-optic crystal comprises $LiNbO_3$.

6. The laser output device of claim 1, wherein the holographic material is coupled directly to a surface of the electro-optic crystal.

7. The laser output device of claim 1, wherein the holographic material is coupled to a surface of the electro-optic crystal in a volume configuration.

8. The laser output device of claim 1, further comprising glass coupled to the holographic material.

9. The laser output device of claim 1, wherein the holographic material is coupled to a surface of the electro-optic crystal in a surface relief configuration.

10. The laser output device of claim 1, further comprising at least one collimating lens.

11. The laser output device of claim 1, wherein the one or more properties of the holographic wavelength actuator are configured to be adjusted to select an axial mode of the laser output and an optical path length of the laser output.

12. The laser output device of claim 1, wherein at least one of the adjustable properties comprises an index of refraction of the electro-optic crystal.

13. The laser output device of claim 1, wherein the holographic wavelength actuator is configured to perform as a diffraction grating, and wherein at least one of the adjustable properties comprises a grating diffraction center wavelength of the holographic wavelength actuator.

14. The laser output device of claim 1, wherein the holographic wavelength actuator is configured to perform as a diffraction grating, and wherein at least two of the adjustable properties comprises an index of refraction of the electro-optic crystal and a grating diffraction center wavelength of the holographic wavelength actuator.

15. The laser output device of claim 1, wherein the electro-optic crystal is configured to adjust the properties of the holographic material.

16. The laser output device of claim 1, wherein the holographic wavelength actuator is configured to perform as a diffraction grating, and wherein the electro-optic crystal controls a grating angle of the diffraction grating depicted in the holographic material to select and tune the wavelength of the laser output.

17. The laser output device of claim 1, wherein the electro-optic crystal and the holographic wavelength actuator are configured to actively correct for mode hop in the laser output.

18. The laser output device of claim 1, wherein the electro-optic crystal and the holographic wavelength actuator are configured to stabilize the wavelength of the laser output.

19. A method for wavelength selection and tuning, comprising:
  providing a laser output from a laser emitting device; and
  selecting and tuning a wavelength of the laser output by adjusting one or more properties of a holographic wavelength actuator optically coupled to the laser emitting device, wherein the holographic wavelength actuator comprises a holographic material coupled to an electro-optic crystal.

20. The method of claim 19, further comprising correcting for active mode hopping using the holographic wavelength actuator.

21. The method of claim 19, further comprising controlling the properties of the holographic wavelength actuator using the electro-optic crystal.

22. The method of claim 19, wherein the holographic wavelength actuator is configured to perform as a diffraction grating, and wherein the method further comprises selecting and tuning the wavelength of the laser output by adjusting an index of refraction of the electro-optic crystal and a grating diffraction center wavelength of the diffraction grating depicted in the holographic material.

23. The method of claim 19, further comprising adjusting the properties of the holographic wavelength actuator to select an axial mode of the laser cavity.

* * * * *